United States Patent [19]

Jeandot et al.

[11] 4,296,383
[45] Oct. 20, 1981

[54] BALANCING AMPLIFIER

[75] Inventors: Jean-Louis Jeandot, Paris; Emmanuel Lefort, L'Hay-les-Roses, both of France

[73] Assignee: Telecommunications Radioelectriques et Telephoniques T.R.T., Paris, France

[21] Appl. No.: 31,648

[22] Filed: Apr. 19, 1979

[30] Foreign Application Priority Data

May 16, 1978 [FR] France ............................... 78 14397

[51] Int. Cl.$^3$ .............................................. H03F 3/45
[52] U.S. Cl. .................................... 330/301; 330/259; 330/260
[58] Field of Search ................ 330/117, 259, 260, 301

[56] References Cited

U.S. PATENT DOCUMENTS 3,399,357  8/1968  Weilerstein ......................... 330/260
3,622,903  11/1971  Steckler ........................... 330/260 X

OTHER PUBLICATIONS

Donofrio et al., "Differential Shunt Feedback Sense Amplifier", *IBM Technical Disclosure Bulletin*, vol. 12, No. 12, May 1970, p. 2123.

*Primary Examiner*—James B. Mullins
*Attorney, Agent, or Firm*—William J. Streeter; Bernard Franzblau

[57] ABSTRACT

A balancing amplifier comprising a pair of transistors arranged as a differential amplifier and a negative feedback network including a transistor voltage follower as a part of the load circuit of each transistor of the pair of transistors. Owing to the negative feedback network high level signals can be balanced. The amplifier provides output signals in phase opposition from a single-ended input signal.

20 Claims, 5 Drawing Figures

3a

3b

3c

BALANCING AMPLIFIER

The invention relates to a balancing amplifier comprising a pair of transistors arranged as a differential amplifier, the control electrode of one transistor receiving the signal to be balanced.

In order to realize a balancing amplifier, i.e. an amplifier which, starting from a signal applied to its input, produces two signals of the same amplitude and of opposite phase at its output, it is known to employ a differential amplifier. One input of said amplifier receives the signal to be balanced, and the other input is connected to a source of fixed potential. The input signal causes current variations of opposite sense in the load circuit of the transistors of the pair.

A drawback of these differential amplifiers is that they supply output voltages which are distorted relative to the input signal. This distortion appears when the relevant voltage between the control electrodes of the transistor pair exceeds some tens of millivolts. In order to eliminate this drawback, it has been proposed to include resistors in the emitter circuits of the transistors when they are of the bipolar type. Thus the distortion is actually reduced, but the amplifier gain is also reduced.

The invention provides a balancing amplifier which combines a low distortion with an acceptable gain.

To this end a balancing amplifier in accordance with the invention is characterized in that in each of the load circuits of the transistors of the pair there is provided a transistor arranged as a voltage follower in order to supply, by means of a negative feedback network, a negative feedback voltage to the control electrode of the transistor to which it is connected when the control electrode receiving the signal to be balanced is connected to the input terminal via an input impedance.

The invention will be explained by means of the following description taken with reference to the accompanying drawings, in which.

Figure 1:
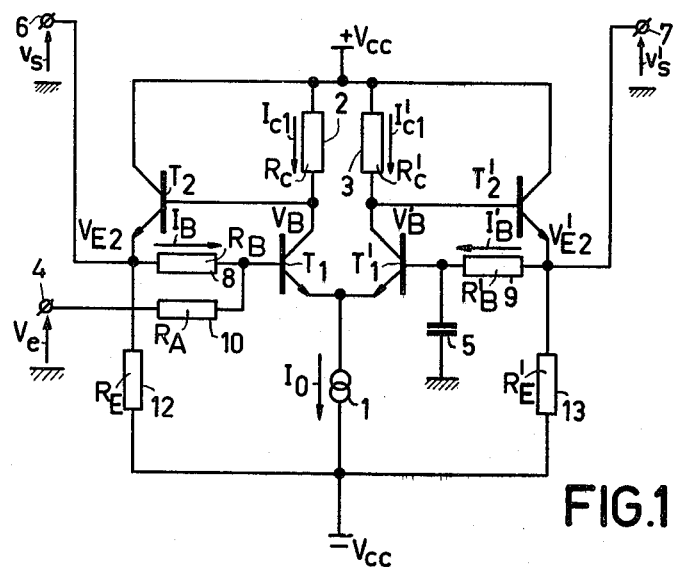
FIG. 1 shows the circuit diagram of the balancing amplifier in accordance with the invention.

The balancing amplifier shown in FIG. 1 employs bipolar transistors. Two of these transistors, designated by the reference symbols $T_1$ and $T'_1$ respectively, are arranged as a differential amplifier. The emitter of these transistors are connected together to a circuit 1 which presents a high impedance to variations of the emitter currents of transistors $T_1$ and $T'_1$. This circuit 1 is generally constituted by a current generator which supplies a current $I_o$. In order to connect the collectors of the transistors $T_1$ and $T'_1$ to a supply voltage source supplying a voltage $V_{cc}$, there have been provided two resistors 2 and 3 which respectively have a value $R_c$ and $R'_c$. The control electrode of the transistor $T_1$, its base, receives a signal $v_e$ which is applied to the input terminal 4 of the balancing amplifier, whereas the base of the transistor $T'_1$ is connected to ground via a capacitor 5. Thus, the base of transistor $T'_1$ is connected to a fixed potential for potential variations which are rapid relative to for example thermal drift.

The signals $v_s$ and $v'_s$ representing the input signal $v_e$ appear in phase opposition at the output terminals 6 and 7. This may be written as:

$$v_s = A\, v_e$$

$$v'_s = -A\, v_e$$

where A is the amplifier gain.

In accordance with the invention the balancing amplifier is characterized in that in each of the load circuits, which in the present example are constituted by the resistors 2 and 3, there is provided a transistor $T_2$ and $T'_2$ respectively, arranged as a voltage follower for supplying, via resistors 8 and 9 respectively having the values $R_B$ and $R'_B$, a negative feedback voltage which appears at the emitters of the transistors $T_2$ and $T'_2$ when the control electrode of the transistor $T_1$ is connected to the input terminal 4 via a resistor 10 having the value $R_A$.

The collectors of the transistors $T_2$ and $T'_2$ are brought to a potential $V_{cc}$. Via the resistors 12 and 13 of the value $R_E$ and $R'_E$, respectively, the emitters of the transistors are connected to a negative supply voltage source supplying a voltage $-V'_{cc}$.

In order to realise this amplifier as an integrated circuit, it is to be noted that said resistors $R_E$ and $R'_E$ are preferably replaced by transistors connected as a current generator.

Such a balancing amplifier operates as follows.

First of all the behaviour of the circuit for direct current is considered and in that case no allowance is made for the branch formed by the resistor 10 connected between the terminal 4 and the base of the transistor $T_1$.

Since the transistors $T_1$ and $T'_1$ are arranged as a differential amplifier, their collector currents $I_{c1}$ and $I'_{c1}$ may be represented by:

$$I_{c1} = \frac{I_o}{2}[1 + g \cdot (v_B - v_B' - v_{off})] \quad (1)$$

$$I'_{c1} = \frac{I_o}{2}[1 - g \cdot (v_B - v_B' - v_{off})] \quad (2)$$

In these formulas:

$I_o$ is the current supplied by the current generator 1, g is the reduced transconductance, the normal transconductance G being related to said reduced transconductance by:

$$G = g\frac{I_o}{2}$$

$V_B$ and $V'_B$ are the base voltages of the transistors, and $V_{off}$ is the offset voltage.

The collector potentials of the transistors $T_1$ and $T'_1$, $V_{c1}$ and $V'_{c1}$, and the emitter potentials of the transistors $T_2$ and $T'_2$, $V_{E2}$ and $V'_{E2}$, are written as:

$$V_{c1} = V_{cc} - R_c I_{c1} \quad (3)$$

$$V'_{c1} = V_{cc} - R'_c I'_{c1} \quad (4)$$

$$V_{E2} = V_{c1} - V_{BE2} \quad (5)$$

$$V'_{E2} = V'_{c1} - V'_{BE2} \quad (6)$$

In these formulas:

$V_{BE2}$ and $V'_{BE2}$ are the voltages between the bases and emitters of $T_2$ and $T'_2$.

When the voltage drops caused by the resistors $R_B$ and $R'_B$, through which the currents $I_B$ and $I'_B$ flow, are considered, the following may be written:

$$V_B = V_{E2} - R_B I_B = V_{E2} - R_B \frac{I_{c1}}{\beta} \quad (7)$$

$$V_B' = V_{E2}' - R_B' I_B' = V_{E2}' - R_B' \frac{I_{c1}'}{\beta'} \quad (8)$$

where $\beta$ and $\beta'$ respectively represent the current gain of transistors $T_1$ and $T'_1$.

With the aid of these formulas the relationship between the quantity $V_{E2} - V'_{E2}$, representing the balancing of the circuit arrangement and its parameters, is determined; this yields:

$$V_{E2} - V'_{E2} = -(V_{BE2} - V'_{BE2}) \frac{1+\tau}{1+K+\tau} - \frac{I_0}{2}\left[(R_c - R_c')\frac{1+\tau}{1+K+\tau} - \left(\frac{R_B}{\beta} - \frac{R_B'}{\beta'}\right)\frac{K}{1+K+\tau}\right] + V_{off} \cdot \frac{K}{1+K+\tau} \quad (9)$$

In this formula:

$$K = g\frac{I_0}{2}(R_c + R_c')$$

$$\tau = g\frac{I_0}{2}\left(\frac{R_B}{\beta} + \frac{R_B'}{\beta'}\right)$$

This formula is now compared with that relating to a balancing amplifier in which the resistors $R_B$ and $R'_B$ are not included and the bases of transistors $T_1$ and $T'_1$ are connected to ground; this yields:

$$V_{E2} - V'_{E2} = -(V_{BE2} - V'_{BE2}) - \frac{I_0}{2}(R_c - R_c') + KV_{off} \quad (10)$$

The advantages of the balancing amplifier in comparison with a conventional differential amplifier are apparent from equation (9).

The influence of the potential differences $V_{BE2}$ and $V'_{BE2}$ on the output voltages is reduced as K increases. It is to be noted that the adverse effect of the offset voltage $V_{off}$ on the output voltages is reduced by a factor equal to $1+K+\tau$.

Now the gain of such an amplifier for variable signals will be examined. First the amplifier will be considered without the resistors 8 and 9. This amplifier consequently has a gain K. Subsequently, it is found that the balancing amplifier in accordance with the invention can be obtained from the preceding amplifier by adding the feedback resistor $R_B$ and the resistor of the value $R_A$. The resistor of the value $R'_B$ has no effect on the gain for variable signals because the capacitor 5 brings the base of transistor $T'_1$ to ground potential for variable signals. Thus, the gain A of the balancing amplifier in accordance with the invention is:

$$A = \frac{V_s}{V_e} = -\frac{R_B}{R_A}\left[\frac{1}{1+\frac{1}{K}\left(1+\frac{R_B}{R_A}\right)}\right]$$

and if $R_B/R_A = 10$ and $K = +100$ this yields: $A = -9.9$.

Since it is assumed that the distortion of the balancing amplifier is attributable to a value of K which depends on the amplitude of the input signal, the gain A depends almost solely on the values $R_B$ and $R_A$.

Figure 2:
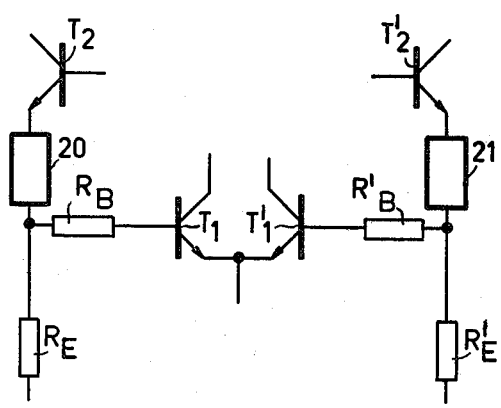
FIG. 2 shows a variant of the balancing amplifier in accordance with the invention.

In order to improve the behaviour of the balancing amplifier in accordance with the invention at high levels, it is desirable to include voltage dropper devices 20 and 21 in the emitter circuits of the transistors $T_2$ and $T'_2$, which is shown in FIG. 2 in which corresponding elements bear the same reference numerals as in FIG. 1. Thus, a collector-base voltage for the transistors $T_1$ and $T'_1$ is obtained which is such as to ensure operation of these transistors in the linear portion of their characteristics.

Figure 3:
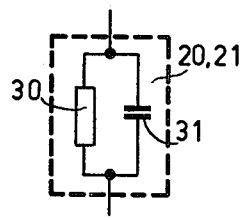
FIGS. 3a, 3b and 3c show in detail how the voltage dropper device employed in the amplifier shown in FIG. 2 can be realized.
Figure 3:
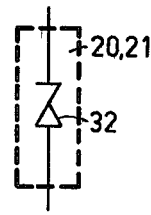
Figure 3:
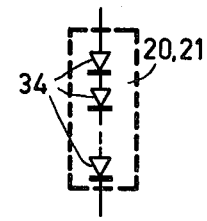

FIGS. 3a, 3b and 3c represent the voltage dropper devices suitable for the balancing amplifier in accordance with the invention.

The device shown in FIG. 3a comprises a resistor 30 shunted by a capacitor 31, while that of FIG. 3b is constituted by a zener diode 32. FIG. 3c shows another example of a voltage dropper device. This device is constituted by an assembly of normal diodes 34 connected in series. In certain cases a single diode may suffice.

Although a balancing amplifier has been described which employs only bipolar transistors, it is evident that field-effect transistors may be used without departing from the scope of the invention.

What is claimed is:

1. A balancing amplifier comprising a single input terminal for connection to a signal to be balanced, a pair of transistors connected as a differential amplifier with a control electrode of one transistor of the differential amplifier coupled to said input terminal via an input impedance element, each of the transistors having a load circuit provided with a transistor arranged as a voltage follower for supplying, by means of a negative feedback network, a negative feedback voltage to the control electrode of the transistor of the differential amplifier to which the network is connected in response to a signal at the input terminal.

2. A balancing amplifier as claimed in claim 1 further comprising a voltage dropper device connected between an output electrode of the voltage follower transistor and the negative feedback network.

3. A balancing amplifier as claimed in claim 2 wherein the voltage dropper device comprises a resistor shunted by a capacitor.

4. A balancing amplifier as claimed in claim 2 wherein the voltage dropper device comprises a zener diode.

5. A balancing amplifier as claimed in claim 2 wherein the voltage dropper device comprises at least one "normal" diode.

6. An amplifier as claimed in claims 1 or 2 further comprising means connecting the output electrodes of the transistors arranged as voltage followers to a voltage source via a network having a high impedance.

7. An amplifier as claimed in claim 6 wherein the network having a high impedance comprises a resistor.

8. An amplifier as claimed in claim 6 wherein the network having a high impedance comprises a current generator.

9. A balancing amplifier as claimed in claims 1 or 2 wherein the transistors comprise bipolar transistors.

10. A balancing amplifier as claimed in claims 1 or 2 wherein the feedback network comprises a resistor.

11. A balancing amplifier as claimed in claims 1 or 2 further comprising a capacitor coupling a control electrode of the other transistor of said pair of transistors to a source of fixed voltage.

12. A balancing amplifier comprising, first and second transistors coupled together to form a differential amplifier, a single input terminal for connection to a source of analog signal, an impedance element coupling the input terminal to a control electrode of said first transistor, means for AC coupling a control electrode of the second transistor to a point of reference voltage, first and second negative feedback voltage networks coupling output electrodes of said first and second transistors to the control electrodes thereof, respectively, each of said feedback networks including a transistor connected as a voltage follower with an output electrode thereof coupled to the control electrode of the corresponding transistor of the differential amplifier, and first and second output terminals coupled respectively to the output electrodes of the voltage follower transistors to provide first and second output signals of opposite phase.

13. An amplifier as claimed in claim 12 further comprising a current generator, and means coupling a common electrode of said first and second transistors to a source of DC supply voltage via said current generator.

14. An amplifier as claimed in claim 12 wherein said impedance element comprises a resistor with a resistance value $R_A$ and the first negative feedback network includes a feedback resistor having a resistance value $R_B$ connected between the output electrode of the voltage follower transistor of the first negative feedback network and the control electrode of said first transistor, and wherein $R_B > R_A$.

15. An amplifier as claimed in claim 14 wherein the ratio of $R_B$ to $R_A$ is approximately 10 to 1 and the gain of the amplifier is determined primarily by said ratio.

16. An amplifier as claimed in claim 14 further comprising a voltage dropping device connected in series with said feedback resistor between said voltage follower transistor output electrode and said first transistor control electrode and in the order recited.

17. An amplifier as claimed in claim 16 wherein said voltage dropping device comprises a resistor and capacitor connected in parallel.

18. An amplifier as claimed in claim 12 wherein said AC coupling means comprises a capacitor.

19. An amplifier as claimed in claims 12, 14, 16 or 18 further comprising current generator means coupled between the output electrodes of the voltage follower transistors and a source of reference voltage.

20. An amplifier as claimed in claims 12 or 18 wherein the impedance element comprises a passive circuit element having relatively fixed parameters for impeding current flow.

* * * * *